United States Patent [19]

Takahashi

[11] Patent Number: 4,823,027

[45] Date of Patent: Apr. 18, 1989

[54] SAMPLE AND HOLD CIRCUIT

[75] Inventor: Koushiro Takahashi, Fujisawa, Japan

[73] Assignee: Matsushita Electric Industrial Co., Ltd., Kadoma, Japan

[21] Appl. No.: 111,093

[22] Filed: Oct. 19, 1987

Related U.S. Application Data

[63] Continuation of Ser. No. 846,812, Apr. 1, 1986, abandoned.

[30] Foreign Application Priority Data

Apr. 10, 1985 [JP] Japan .................................. 60-75602

[51] Int. Cl.$^4$ .............................................. G11C 27/02
[52] U.S. Cl. ..................................... 307/353; 328/151
[58] Field of Search ........................ 307/352, 353, 491; 328/151

[56] References Cited

U.S. PATENT DOCUMENTS 3,226,650 12/1965 Higbie ................................. 307/353
4,352,070 9/1982 Beauducel et al. ................. 307/353
4,366,456 12/1982 Ueno et al. .
4,430,622 2/1984 Simoes .

FOREIGN PATENT DOCUMENTS 0050394 3/1982 Japan .................................. 307/353
2068189 8/1981 United Kingdom .

OTHER PUBLICATIONS

Electronics, vol. 46, No. 20, Sep. 27, 1973, pp. 127–128.

Primary Examiner—John Zazworsky
Attorney, Agent, or Firm—Wenderoth, Lind & Ponack

[57] ABSTRACT

A sample hold circuit includes a serially connected input switching element and output switching element, and a hold circuit connected between the connecting point of both switching elements and a reference potential, with stray capacity and other capacity components present at the output side of the output switching element, wherein a switching element, which is made to conduct only for a short time immediately before conduction of the output switching element, is connected in parallel to the capacity components.

7 Claims, 4 Drawing Sheets

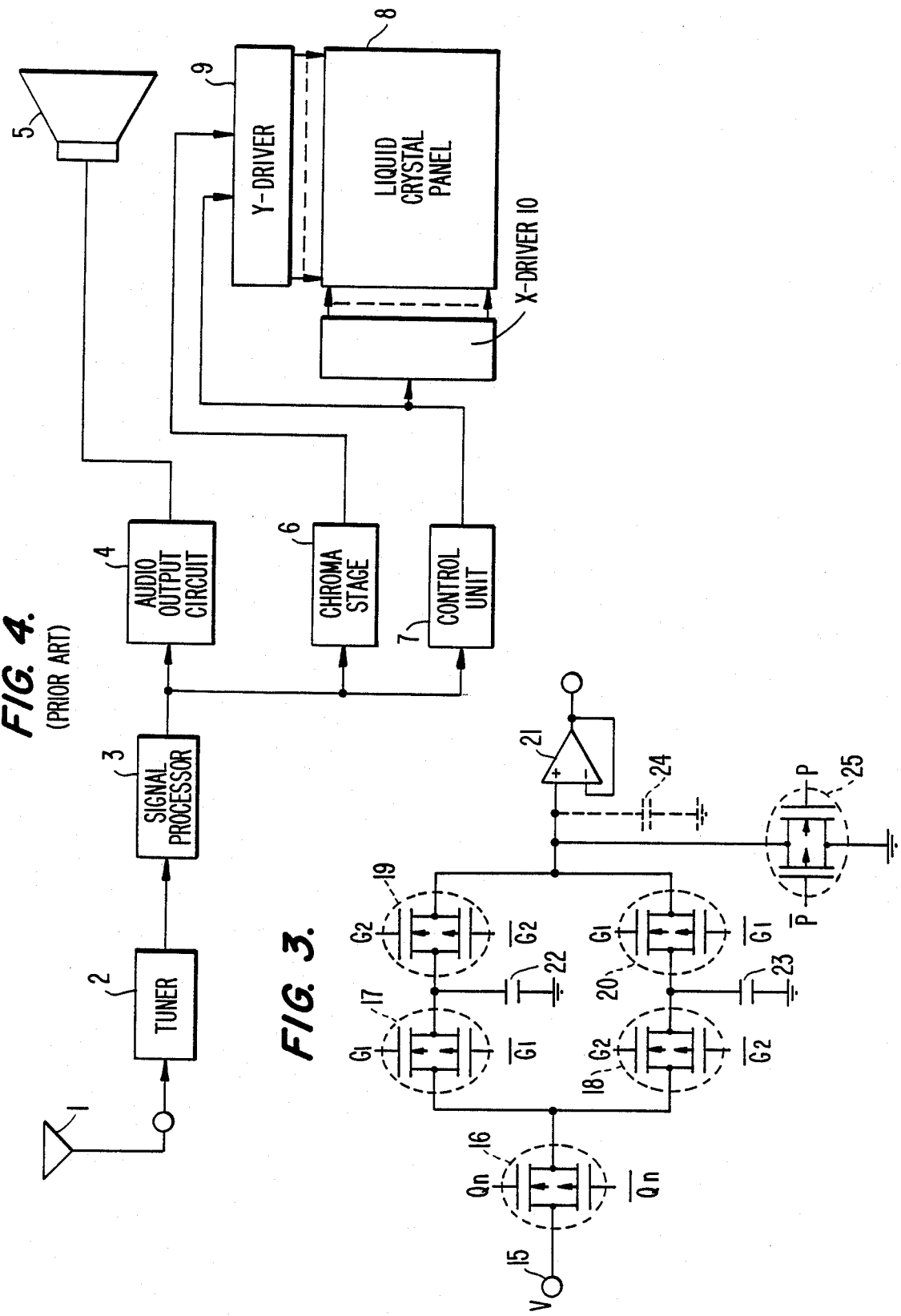

SAMPLE AND HOLD CIRCUIT

This application is a continuation, of now abandoned application Ser. No. 846,812, filed Apr. 1, 1986.

BACKGROUND OF THE INVENTION

1. Field of Industrial Use

This invention relates to a sample and hold circuit which may be used, for example, as a liquid crystal panel driving circuit of a television receiver.

2. Description of the Prior Art

Liquid crystal television receivers employing liquid crystal panels as display elements have been developed recently. To begin with, the outline of operation of this liquid crystal television receiver is described below.

FIG. 4 shows a general construction of a liquid crystal television receiver. Television signals sent from a broadcasting station are received by an antenna 1, and are converted in frequency by a tuner 2 to an intermediate frequency. The television signals converted into an intermediate frequency are amplified and detected in a signal processing circuit 3, and audio signals and video signals are obtained. The audio signals are delivered to a speaker 5 by way of an audio output circuit 4, while video signals are applied to a chroma stage 6. The chroma stage 6 comprises a chroma processing unit and chroma output unit, and the video signals are demodulated into R, G, B signals in the chroma processing unit, and are converted into signals inverted in the polarity in every field by the chroma output unit to be applied to a Y driver IC 9. The video signals applied to the Y driver IC 9 are sampled and held, and are applied to the source line of an active matrix type liquid crystal panel 8. At the same time, the video signals are added to a control unit 7, in which various control pulses are obtained, and are applied to the control signal input terminals of X driver IC 10 and Y driver IC 9. The X driver IC 10 is intended to scan in the vertical direction, and its output is applied to the gate line of the active matrix type liquid crystal panel 8. Thus, by the vertical direction scanning pulses from the X driver IC 10 and video signals from the Y driver IC 9, a television picture is obtained on the active matrix type liquid crystal panel 8.

Referring now to the outline of the operation of the Y driver IC 9 shown in FIG. 4, an example of the composition of the Y driver IC is shown in FIG. 5. The R, G, B signals from the chroma stage are applied to R, G, B terminals, and are changed over in every horizontal period by an analog multiplexer 11 to be fed into three video signal lines 12. The analog multiplexer 11 changes over according to the R, G, B picture element arrangement on the liquid crystal panel. Numeral 13 denotes a shift register, which receives a clock $\phi_Y$ and start pulse S, and delivers sampling pulses $Q_1$, $Q_2$ and so forth sequentially. Numeral 14 denotes a sample and hold circuit and operational amplifier, which are designed to sample the video signals from the video signal line 12 according to the sampling pulses $Q_1$, $Q_2$ and so forth from the shift register, and hold them according to the pulses $G_1$, $G_2$ applied from outside. The outputs of the sample hold circuit and operational amplifier 14 are connected to output terminals $Y_{01}$, $Y_{02}$, ... of the Y driver IC, and these output terminals are connected to the source line of the active matrix liquid crystal panel.

One block (the n-th) of the sample and hold circuit and operational amplifiers in FIG. 5 are shown in FIG. 6, in which numeral 15 denotes a video signal line, and 16 to 20 are switching circuits which operate by turning on when a pulse of the signal indicated by each arrow is a high level, and turning off when it is a low level. Numeral 16 is a switching circuit for video signal sampling, and its output is applied to two input switching circuits 17 and 18, and hold capacitors 22 and 23 are respectively to the output terminals of the input switching circuits 17 and 18, while output switching circuits 19 and 20 are respectively connected to the output terminals of the hold capacitors 22 and 23. Output terminals of these two output switching circuits 19 and 20 are coupled together, and are connected to the input terminal of an operational amplifier 21 having an input capacity 24, and the output terminal of the operational amplifier 21 becomes output terminal $Y_{0n}$ of Y driver IC, and is connected to the source line of the liquid crystal panel.

In thus composed sample and hold circuit, the operation is as described below.

Waveforms of the sample and hold circuit and operational amplifier in FIG. 6 are shown in FIG. 7, in which V is a video signal applied to the video signal line 15, and in which one horizontal period is represented by 1H. $G_1$, $G_2$ are control pulses applied to switching circuits 17 to 20 of the sample and hold circuit the period of both $G_1$ and $G_2$ is 2H, and their phases differ by $\pi$. In order to perform the sample and hold securely, there is a period t in which both $G_1$ and $G_2$ are off. The period in which either $G_1$ or $G_2$ is on is indicated by $t_1, t_2, \ldots$. The signal $Q_n$ is an n-th output pulse of the shift register 13, and it is a video signal sampling pulse used to open or close the switching circuit 16. $V_{na}$ and $V_{nb}$ are information voltage waveforms whose values are held by hold capacitors 22 and 23, and $Y_{0n}$ is an n-th output waveform of Y driver IC. In the period $t_1$, $G_2$ is on and $G_1$ is off, so that the information voltage $V_{na}$ of hold capacitor 22 is transmitted to the output $Y_{0n}$ of Y driver IC, and video information voltage $V_{nb}$ is sampled and held in the hold capacitor 23 by the sampling pulse of $Q_n$. Next, in the period $t_2$, when $G_1$ is on and $G_2$ is off, the information voltage $V_{nb}$ which has been sampled in the $t_1$ period is transmitted to the output $Y_{0n}$ of Y driver IC, while the video information voltage $V_{na}$ is sampled and held in the hold capacitor 22 by the sampling pulse $Q_n$. Thereafter, in the period of $t_3$, $t_4$ and so forth, the operations in the period of $t_1$ and $t_2$ are similarly repeated.

In this composition, however, there were following problems. That is, the input capacity 24 is always present at the inside side of operational amplifier 21, and when the operational amplifier is composed of CMOS elements, in particular, the value of input capacity is considerably large. As compared with the values of hold capacitors 22 and 23, the value of the input capacity 24 of the operational amplifier is generally too great to be ignored, and, therefore, when the output side switching circuits 19 and 20 are turned on, the voltage being held by the hold capacitors 22 and 23 is influenced by the electric charge 1H before which was accumulated in the input capacity 24 of the operational amplifier 21 in the output $Y_{0n}$ of Y driver IC, so that the input voltage may not be delivered at a high fidelity. In the example shown in FIG. 7, the vaue of $Y_{0n}$ in the $t_2$ period, which should be the voltage of the same level as in the period $t_3$ as indicated by dot-dash line, is actually an upward shifted output voltage due to the effect of the operational amplifier input voltage in the period $t_1$. The above operation is explained in the two-system construction of a sample and hold circuit, but the same holds true in a one-system construction of a sample and hold circuit. Hence, the problem is, when the conventional sample and hold circuit and operational amplifier as shown in FIG. 6 are used, for example, in a liquid crystal television, brightness changes occur where the brightness should be the same.

In the light of the above-discussed problem, this invention is intended to present a sample and hold circuit which is capable of eliminating the adverse effects of the capacity component if the capacity component is present at the output side.

SUMMARY OF THE INVENTION

This invention comprises a sample and hold circuit wherein a hold capacitor is connected between the output terminal of an input switching element and a reference potential; an output switching element is connected to an output terminal of the hold capacitor; a capacity component is present at an output side of the output switching element; and a discharge switching element for discharging the capacity component so as to thereby return the output potential to the reference potential, is provided in parallel to the capacity component, the discharge switching element conducts for a short period immediately before the output switching element conducts.

This invention, having the above construction, can discharge the electric charge of the capacity component accumulated so far, by means of the discharge switching element, immediately before the output from the hold capacity is applied to the capacity component of the output side, and can return the output potential to the reference potential, so that the next hold voltage may be accurately delivered regardless of the previous output signal value.

BRIEF DESCRIPTION OF THE DRAWINGS

FIG. 3 is a circuit diagram showing a practical example of the circuit of FIG. 1; FIG. 4 is a block diagram showing a general construction of a conventional liquid crystal television receiver.

DETAILED DESCRIPTION OF THE PREFERRED EMBODIMENT

One of the embodiments of a sample and hold circuit of this invention is described below while referring to the accompanying drawings.

Figure 1:
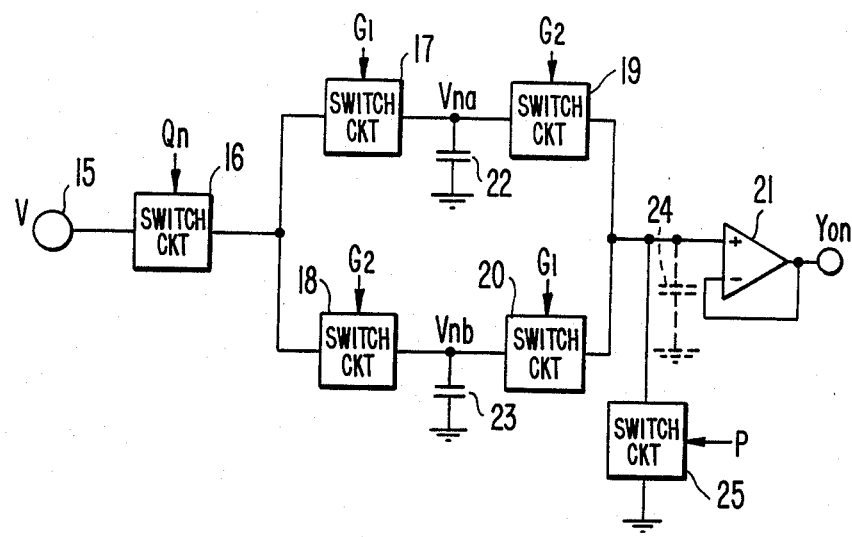
FIG. 1 is a circuit diagram of a sample and hold circuit according to one of the embodiments of this invention.
Figure 6:
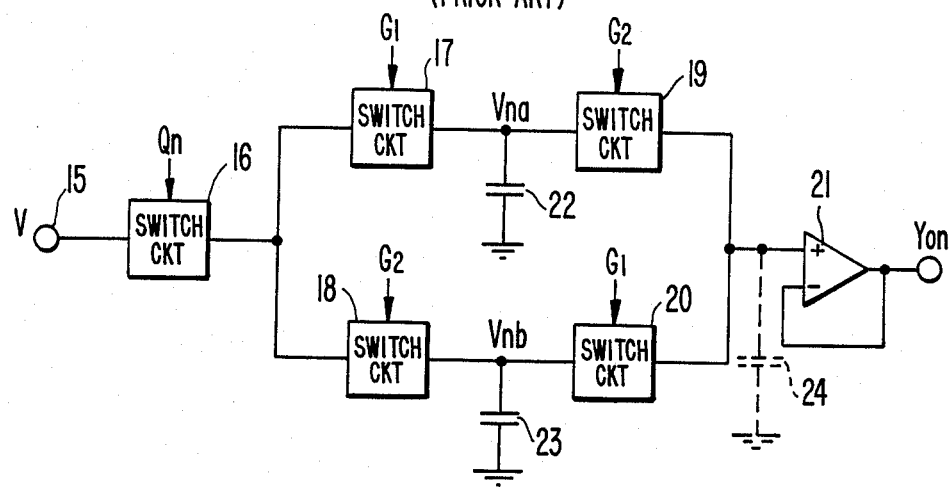
FIG. 6 is a circuit diagram of a conventional example of a sample and hold circuit.

FIG. 1 shows the construction of a sample and hold circuit according to one embodiment of this invention, in which numerals 15 to 24 correspond to the parts of the conventional construction shown in FIG. 6. In this invention, a switching circuit 25 which turns on and off by the P pulse is newly installed between the output side of the sample and hold circuit and the reference potential (that is, ground).

The operation of the thus composed sample and hold circuit is explained below by referring to FIG. 1 and FIG. 2.

Figure 2:
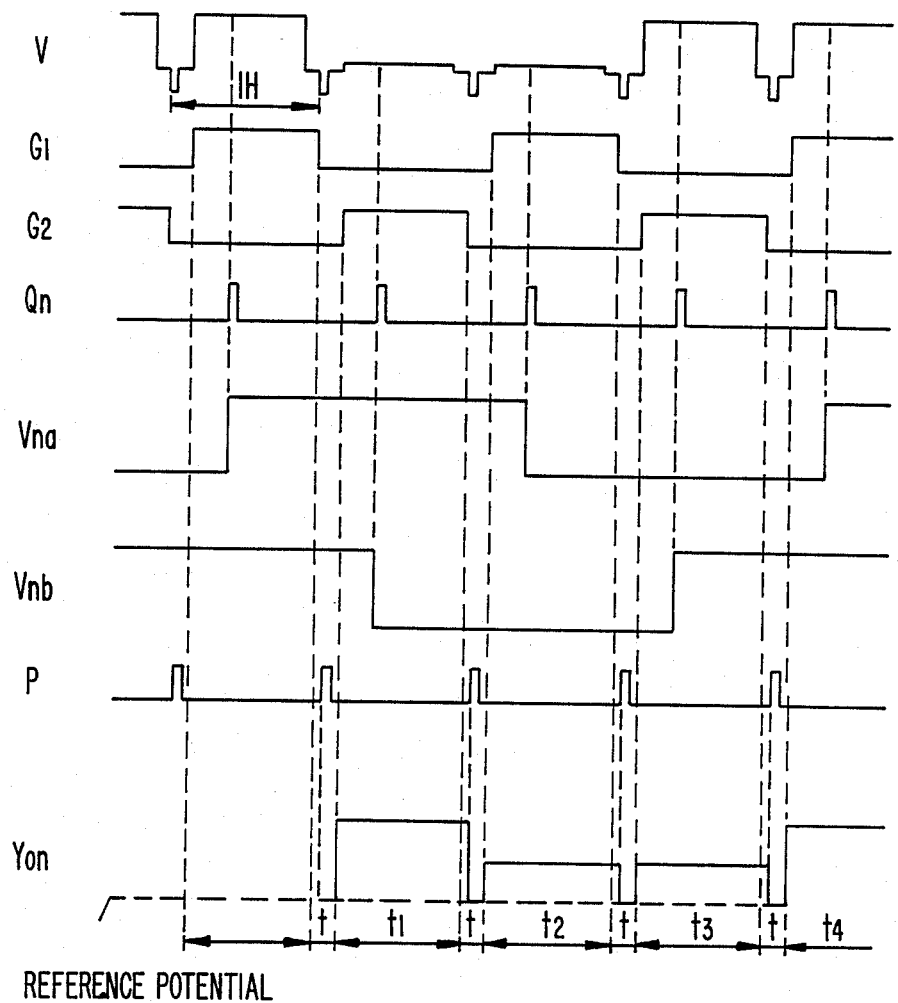
FIG. 2 is a waveform diagram showing the waveforms of parts of the circuits in FIG. 1.
Figure 5:
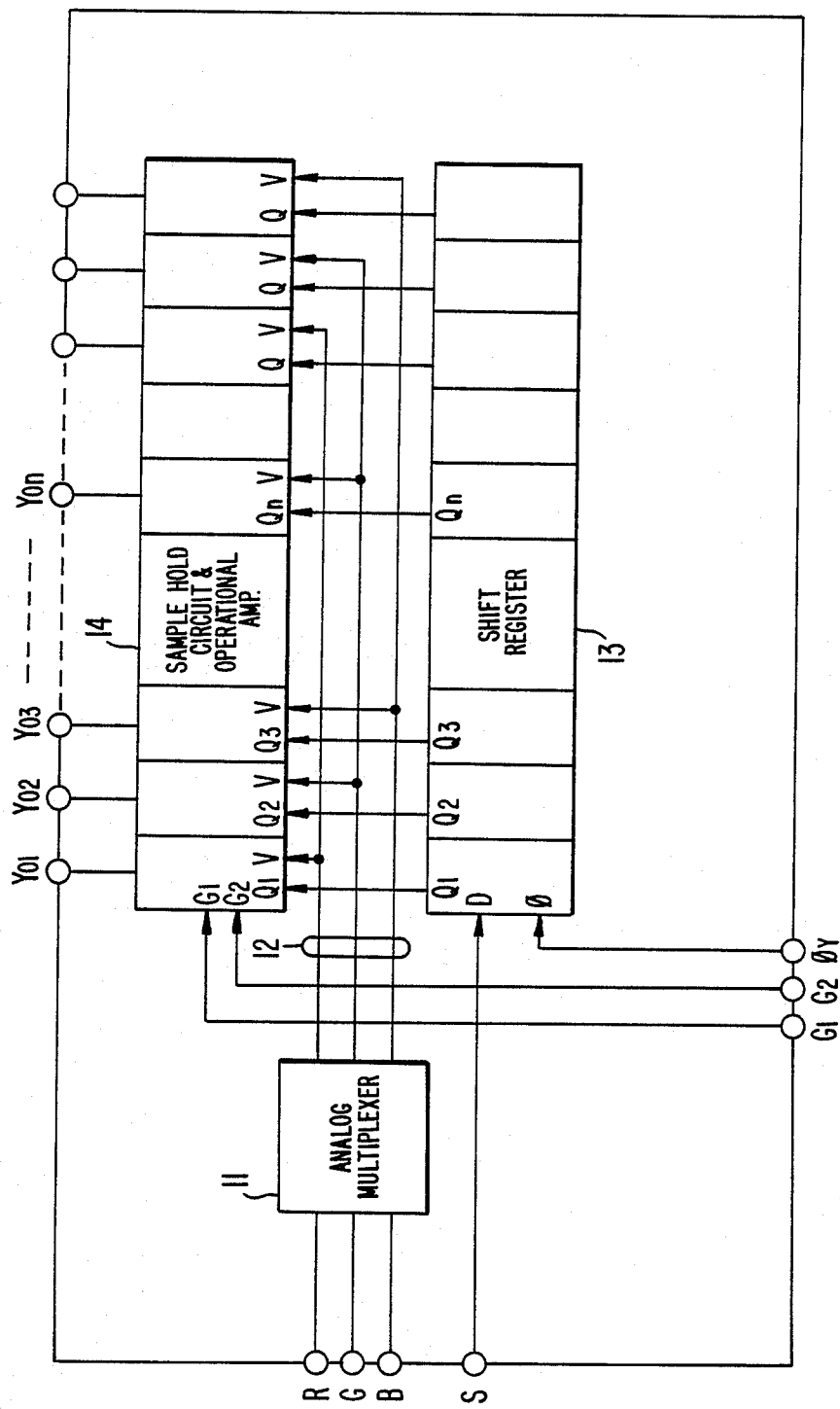
FIG. 5 is a block diagram showing an example of a conventional Y driver IC construction.
Figure 7:
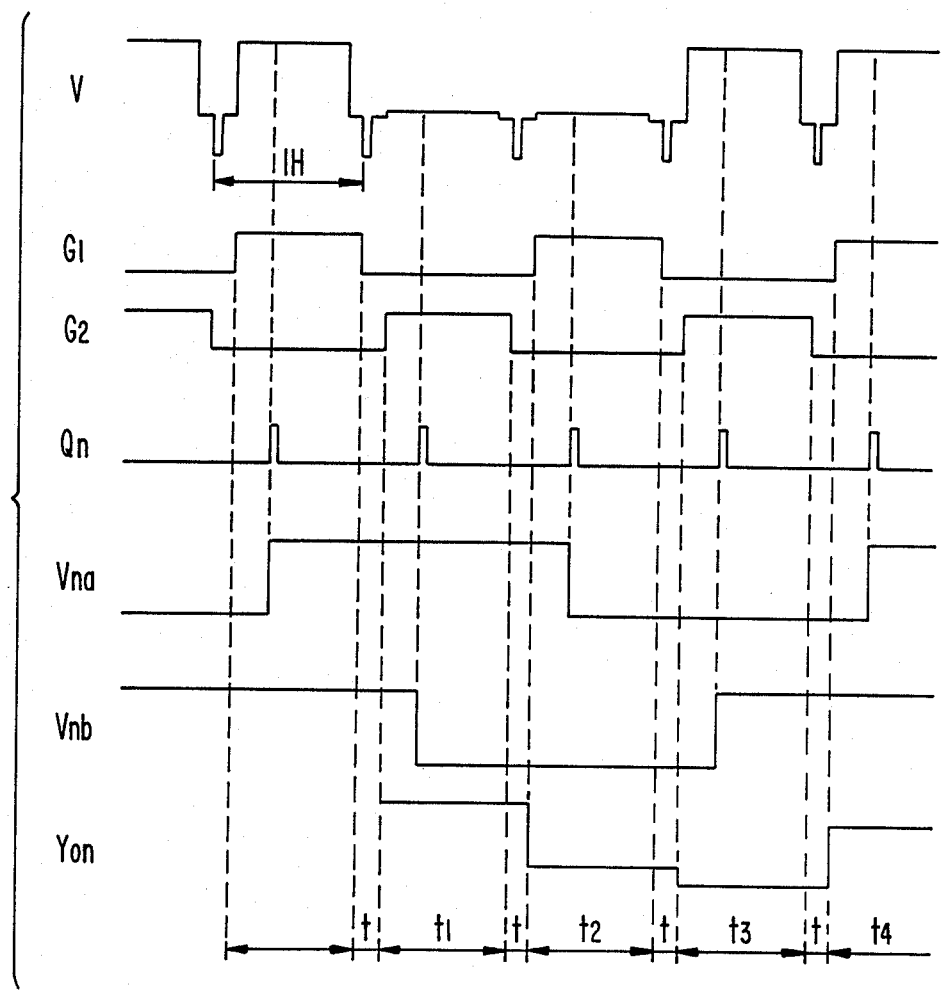
FIG. 7 is a waveform diagram showing waveform of parts of the circuit of FIG. 6.

FIG. 2 shows the waveforms of various parts of the sample and hold circuit in FIG. 1, in which the P pulse which is turned on immediately before $G_1$ or $G_2$ is turned on is newly provided so as to discharge the electric charge accumulated in the capacity component 24. That is, since the output $V_{0n}$ of the Y driver IC is returned to the reference potential when the P pulse is turned on, the voltage is always proportional to the sampled video signal regardless of the effect of the hold voltage 1H before. Therefore, in contradistinction to the waveform shown in FIG. 7, there is no step difference in the $Y_{0n}$ value between the $t_2$ period and $t_3$ period, and the voltage of same level is obtained.

Thus, in this embodiment, by installing a switching element which conducts immediately before the output switching element conducts, between the output circuit side of and sample hold circuit and the reference potential, a and sample hold circuit capable of always correctly delivering outputs corresponding to the input video signals without being influenced by the video signal level 1H before may be realized.

An embodiment of this invention is shown in FIG. 3, in while each switching element is composed of parallel circuits of a p-channel MOS and an n-channel MOS. $\overline{Q}_n$, $\overline{G}_1$, $\overline{G}_2$, $\overline{P}$ represent the polarity inverted pulses of $Q_n$, $G_1$, $G_2$, P respectively. When the operational amplifier 21 is composed of an aluminum gate CMOS, its input capacity 24 is about 0.4 to 1 pF. On the other hand, since the value of hold capacitors 22 and 23 are several pF, effects of the video signal level 1H before may be present about 10 to 20% of the time if there is no switching element 25.

The above explanation relates to the two-system construction of of a sample and hold circuit, but the same holds true with a one-system construction. When this embodiment is applied in a liquid crystal television, it will be very effective.

Thus, by this invention, by installing the discharge switching element which conducts immediately before the output switching element conducts and, i.e., parallel to the capacity component at the output side of the output switching element, a sample and hold circuit capable of always correctly delivering outputs corresponding to the input video signal without being influenced by the video signal level 1H before may be realized.

What is claimed is:

1. A sample and hold circuit comprising:
    an input switching element for sampling an input signal;
    an input means for inputting said input signal to an input terminal of said input switching element;
    a hold capacitor connected between an output terminal of an input switching element and a reference potential;
    an output switching element connected to an output terminal of said hold capacitor;
    an output means for outputting a sample hold output signal from an output terminal of said output switching element;
    a capacity component present at an output side of said output switching element; and a discharge switching element connected between said output terminal of said output switching element and said reference potential;
    wherein said input switching element and said output switching element conduct alternatively, and wherein said discharge switching element conducts for a short period immediately before said output switching element conducts, said discharge switching element discharging said capacity component so as to return its output potential to said reference potential.

2. A sample and hold circuit as set forth in claim 1, wherein two pairs of said input switching elements and output switching elements and said hold capacitors are provided, and wherein said two pairs of input switching elements and output switching elements are alternatively switched.

3. A sample and hold circuit as set forth in claim 1, wherein said capacity component is an input capacity of an amplifier circuit of a subsequent stage attached thereto.

4. A sample and hold circuit as set forth in claim 1, wherein said input signal is a video signal, and said input and output switching elements are switching during one horizontal period of said video signal.

5. A sample and hold circuit comprising:
- an input switching element for sampling an input signal;
- an input means for inputting said input signal to an input terminal of said input switching element;
- a hold capacitor connected between an output terminal of an input switching element and a reference potential; an output switching element connected to an output terminal of said hold capacitor;
- an MOS-type operational amplifier connected to an output terminal of said output switching element;
- a capacity component composed of input capacity of said operational amplifier present at an output side of said output switching element;
- and a discharge switching element connected between said output terminal of said output switching element and said reference potential;
- wherein said input switching element and said output switching element conduct alternatively, and wherein said discharge switching element conducts for a short period immediately before said output switching element conducts, said discharge switching element discharging said capacity component so as to return its output potential to said reference potential.

6. A sample and hold circuit as set forth in claim 5, wherein two pairs of said input switching elements and output switching elements and said hold capacitors are provided, and wherein said two pairs of input switching elements and output switching element are alternatively switched.

7. A sample and hold circuit as set forth in claim 5, wherein said input signal is a video signal, and said input and output switching elements are switched during one horizontal period of said video signal.

* * * * *